US012733492B2

(12) United States Patent
Coffy et al.

(10) Patent No.: US 12,733,492 B2
(45) Date of Patent: Sep. 8, 2026

(54) INTEGRATED CIRCUIT PACKAGE HEAT SINK

(71) Applicant: STMicroelectronics (Grenoble 2) SAS, Grenoble (FR)

(72) Inventors: Romain Coffy, Voiron (FR); Jerome Lopez, Saint Jean de Moirans (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 423 days.

(21) Appl. No.: 18/244,534

(22) Filed: Sep. 11, 2023

(65) Prior Publication Data

US 2024/0087977 A1 Mar. 14, 2024

(30) Foreign Application Priority Data

Sep. 12, 2022 (FR) ....................................... 2209121

(51) Int. Cl.
*H01L 23/367* (2006.01)
*H01L 23/00* (2006.01)
(Continued)

(52) U.S. Cl.
CPC ....... *H10W 40/226* (2026.01); *H10W 40/255* (2026.01); *H10W 90/701* (2026.01);
(Continued)

(58) Field of Classification Search
CPC ............. H01L 23/3672; H01L 23/3735; H01L 23/49816; H01L 24/16; H01L 24/32; H01L 2224/16055; H01L 2224/16225; H01L 2224/32225; H01L 2924/18161; H01L 2924/351; H10W 40/226; H10W 40/255; H10W 90/701; H10W 90/724; H10W 90/734; H10W 72/07253; H10W 72/232; H10W 74/142
See application file for complete search history.

(56) References Cited

U.S. PATENT DOCUMENTS 4,334,221 A 6/1982 Rosenhagen et al.
4,415,025 A * 11/1983 Horvath .............. H01L 23/3672 257/E23.09
(Continued)

FOREIGN PATENT DOCUMENTS

CN 102938616 A 2/2013
CN 104038075 A 9/2014
(Continued)

OTHER PUBLICATIONS

Chowdhury, Anirban, et al: "A Solution to Speeding Related Problem in Road Vehicles Using Passive RFID Tags," 2014 International Conference on Control, Instrumentation, Energy & Communciation (CIEC), pp. 96-100.
(Continued)

*Primary Examiner* — Peniel M Gumedzoe
(74) *Attorney, Agent, or Firm* — Crowe & Dunlevy LLC

(57) ABSTRACT

An integrated circuit includes an electronic chip having a face covered with a thermal interface material layer. A heat sink includes a mounting area fixed to the chip via the thermal interface material layer. The heat sink includes open notches extending into the mounting area to delimit fins separated from each other by the open notches.

24 Claims, 2 Drawing Sheets

(51) Int. Cl.

| | |
|---|---|
| ***H01L 23/373*** | (2006.01) |
| ***H01L 23/498*** | (2006.01) |
| ***H10W 40/22*** | (2026.01) |
| ***H10W 40/25*** | (2026.01) |
| ***H10W 90/00*** | (2026.01) |
| *H10W 72/00* | (2026.01) |
| *H10W 72/20* | (2026.01) |
| *H10W 74/10* | (2026.01) |

(52) U.S. Cl.

CPC .... *H10W 72/07253* (2026.01); *H10W 72/232* (2026.01); *H10W 74/142* (2026.01); *H10W 90/724* (2026.01); *H10W 90/734* (2026.01)

(56) References Cited

U.S. PATENT DOCUMENTS

| | | | |
|---|---|---|---|
| 6,580,167 | B1 * | 6/2003 | Glenn .................. H01L 23/552 257/713 |
| 7,135,827 | B1 | 11/2006 | Lampson |
| 7,288,902 | B1 | 10/2007 | Melanson |
| 8,410,720 | B2 | 4/2013 | Holec et al. |
| 8,988,005 | B2 | 3/2015 | Jungwirth et al. |
| 9,252,691 | B2 | 2/2016 | Li et al. |
| 9,667,122 | B1 | 5/2017 | Huang et al. |
| 9,860,949 | B2 | 1/2018 | Tyson et al. |
| 10,257,896 | B2 | 4/2019 | Tyson et al. |
| 11,651,258 | B2 | 5/2023 | Spero |
| 2003/0057888 | A1 | 3/2003 | Archenhold et al. |
| 2005/0051893 | A1 | 3/2005 | Kuo et al. |
| 2006/0027914 | A1 | 2/2006 | Bish et al. |
| 2008/0197789 | A1 | 8/2008 | Shiotsu et al. |
| 2008/0259627 | A1 | 10/2008 | Salter et al. |
| 2008/0297382 | A1 | 12/2008 | Risbo |
| 2009/0088077 | A1 | 4/2009 | Brown et al. |
| 2009/0109003 | A1 | 4/2009 | Tucker et al. |
| 2009/0174592 | A1 | 7/2009 | Muellner |
| 2009/0243903 | A1 | 10/2009 | Khoury |
| 2009/0251289 | A1 | 10/2009 | Amtmann |
| 2009/0267538 | A1 | 10/2009 | Mantovani |
| 2010/0171598 | A1 | 7/2010 | Mehring |
| 2010/0253240 | A1 | 10/2010 | Inamori |
| 2011/0084807 | A1 | 4/2011 | Logan et al. |
| 2011/0148594 | A1 | 6/2011 | Kang |
| 2011/0248834 | A1 | 10/2011 | Warner et al. |
| 2011/0273271 | A1 | 11/2011 | Alicot |
| 2013/0015798 | A1 | 1/2013 | Wright |
| 2013/0134918 | A1 | 5/2013 | Richards et al. |
| 2014/0086301 | A1 | 3/2014 | Akhavan et al. |
| 2014/0097774 | A1 | 4/2014 | Li et al. |
| 2014/0249825 | A1 | 9/2014 | Proud |
| 2014/0292208 | A1 | 10/2014 | Chemel et al. |
| 2015/0054423 | A1 | 2/2015 | Tyson et al. |
| 2015/0115856 | A1 | 4/2015 | Lim |
| 2015/0187679 | A1 * | 7/2015 | Ho ......................... H01L 23/04 438/118 |
| 2015/0303992 | A1 | 10/2015 | Kim et al. |
| 2016/0019404 | A1 | 1/2016 | Powell |
| 2016/0233855 | A1 | 8/2016 | Jain et al. |
| 2017/0015207 | A1 | 1/2017 | Houda et al. |
| 2017/0017814 | A1 | 1/2017 | Roberts |
| 2017/0071041 | A1 | 3/2017 | Baggen et al. |
| 2018/0041201 | A1 | 2/2018 | Tang et al. |
| 2018/0110103 | A1 | 4/2018 | Tyson et al. |
| 2018/0259171 | A1 | 9/2018 | Pharr et al. |
| 2018/0331011 | A1 * | 11/2018 | Rivera ................. H01L 23/562 |
| 2020/0395269 | A1 | 12/2020 | Dubey et al. |

FOREIGN PATENT DOCUMENTS

| | | | |
|---|---|---|---|
| CN | 107561972 | A | 1/2018 |
| CN | 210053365 | U | 2/2020 |
| DE | 102007060058 | A1 | 6/2008 |
| FR | 2992081 | A1 | 12/2013 |
| JP | 2001043140 | A | 2/2001 |
| JP | 2012134721 | A | 7/2012 |
| WO | 2012079817 | A1 | 6/2012 |

OTHER PUBLICATIONS

Stmicroelectronics, ST25DV02K-W1 ST25DV02K-W2: “Dynamic NFC/RFID Tag IC with 2-Kbit EEPROM with up to 2x pulse width modulation outputs,”,https://www.st.com/resource/en/data_brief/st25dv02k-w1.pdf, Feb. 2018, 3 pages.

Vania et al: “Smart dog feeder design using Wireless communication, MQTT and Android client” 2016 International Conference on Computer, Control, Informatics and Its Applications (IC3INA), IEEE, Oct. 3, 2016 (Oct. 3, 2016), pp. 191-196, XP033069340, DOI: 10.1109/IC3INA.2016.7863048 [extrait le Feb. 23, 2017] * le document en entier*.

INPI Search Report and Written Opinion for priority application, FR 2209121, report dated Apr. 27, 2023, 8 pgs.

* cited by examiner

INTEGRATED CIRCUIT PACKAGE HEAT SINK

PRIORITY CLAIM

This application claims the priority benefit of French Application for Patent No. 2209121, filed on Sep. 12, 2022, the content of which is hereby incorporated by reference in its entirety to the maximum extent allowable by law.

TECHNICAL FIELD

Implementations and embodiments relate to the field of microelectronics, in particular the field of packaging of integrated circuits, and more particularly heat sinks in encapsulation packages.

BACKGROUND

Heat sinks are used to dissipate to the outside of the package the heat produced by the chip of an integrated circuit during its operation. In particular, the heatsink is bonded on the chip with a thermally conductive material allowing the heat to be transferred from the chip to the heat sink.

Nevertheless, conventional heat sinks are subject to mechanical stresses throughout the life of the package, in particular during the manufacture of the package and the operation of the electronic chip. Indeed, the heat produced by the annealing steps during the manufacture of the package, or by the electronic chip, causes expansion of the heat sink and of the chip. However, the heat sink and the chip are made of materials with different coefficients of thermal expansion, and this difference generates mechanical stresses that can cause delaminations (detachments) at the interface between the heatsink and the chip. Delaminations can result from the presence of a layer of air, which is not very thermally conductive, greatly degrading heat dissipation.

Consequently, the detachment of the heat sink no longer allows the heatsink to perform its heat elimination function and can cause a degradation of the thermal performance of the package. The integrated circuit can therefore overheat and become unusable.

There is a need to reinforce the mechanical strength of the heatsink to avoid these phenomena of detachment, and to avoid a degradation of the thermal performance of the integrated circuit package.

SUMMARY

According to one aspect, provision is made of an integrated circuit comprising at least one electronic integrated circuit chip having one face covered with a thermal interface material layer, and a heat sink comprising a mounting area fixed to the chip via the thermal interface material layer.

The heat sink comprises open notches extending into the mounting area so as to form fins separated from each other by the notches.

The fins formed in the mounting area of the heat sink have the advantage of reducing the mechanical stresses, in particular the stresses undergone by the heatsink at the corners of the electronic chip. Indeed, each fin is separated from the neighboring fins by notches which prevent the stresses from being transmitted between the fins. For example, a fin that expands during a thermal cycle of the package generates little or no stress on the part of the chip located opposite the other fins.

Consequently, the heat sink according to this aspect undergoes little mechanical stress and has a reduced risk of delamination, in particular at the corners of the chip on which it is fixed.

According to one embodiment, the notches include radial notches extending between a central region of the mounting area and a peripheral region of the heat sink and peripheral notches extending in the circumference between the mounting area and the peripheral region.

The radial notches allow the fins to be spaced so as to limit the expansion stresses transmitted between them in the mounting area of the heat sink. The peripheral notches allow to space each fin from the peripheral region so as to limit the stresses transmitted to the fins by the peripheral region of the heat sink.

In fact, the open notches in the heat sink are advantageously arranged so that said fins each have degrees of freedom vis-à-vis the other fins, and that are large enough to absorb the differences in thermal expansions undergone by the heatsink and by the chip.

According to one embodiment, the fins are connected to the central region of the mounting area and to the peripheral region by connecting tabs located across the width of the peripheral notches.

The fins are therefore supported on the one hand by the peripheral region via the connecting tabs and on the other hand therebetween, by the central region of the mounting area.

The tabs are further advantageously configured to tolerate a plastic deformation capable of offering the degrees of freedom of the fins vis-à-vis the other fins, as mentioned previously.

According to one embodiment, the mounting area comprises an at least partially ribbed surface including grooves and being in contact with the thermal interface material layer.

The mounting area may provide grooves allowing to deform the thermal interface material layer to increase the attachment surface and to reduce the delamination between the mounting area of the heatsink and the thermal interface material layer while allowing dissipation of heat from the package.

According to one embodiment, said grooves are arranged in concentric circles.

The arrangement of the grooves in concentric circles makes it easier to attach the mounting area on the electronic chip and to limit delamination over the entire surface of the mounting area in the direction of the expansion stresses.

According to one embodiment, the depth of the grooves is comprised between 50 and 300 μm.

The surface of the mounting area fixed to the electronic chip can comprise microscopic or macroscopic grooves to limit the propagation of delamination on this surface. The grooves in particular allow to slow down the propagation of the delamination to a greater or lesser extent depending on their depth.

BRIEF DESCRIPTION OF THE DRAWINGS

Other advantages and features of the invention will appear upon examining the detailed description of non-limiting embodiments and implementations and the appended drawings wherein.

DETAILED DESCRIPTION

Figure 1:
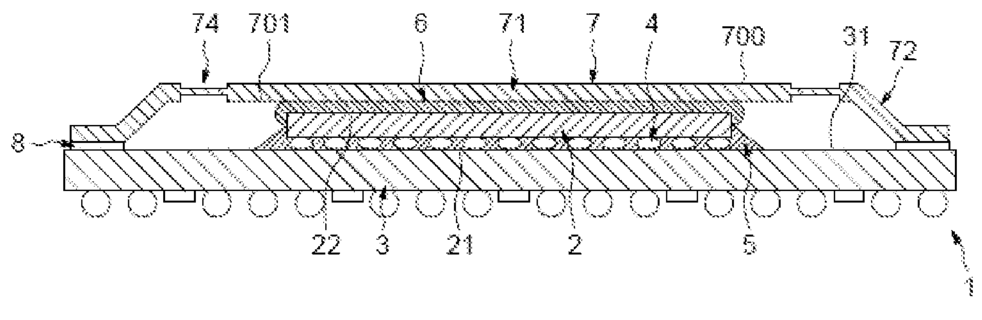
FIG. 1 schematically illustrates a sectional view of an embodiment of a package for an integrated circuit.

FIG. 1 schematically illustrates a sectional view of an embodiment of a package for an integrated circuit 1. The package encapsulates the integrated circuit 1 which comprises an electronic integrated circuit chip 2 mounted on a support substrate 3.

The electronic integrated circuit chip 2 has an upper face 21 fixed on a mounting face 31 of the support substrate 3. The upper face 21 of the chip 2 can be provided with connection balls 4 for example, in a mounting of the "flip chip" type. The connection balls 4 can be embedded in a filling material referred to in the art as an "underfill" and allow to electrically connect the electronic chip 2 to the substrate 3.

The electronic integrated circuit chip 2 also comprises a lower face 22 covered with a thermal interface material (TIM) layer 6. The thermal interface material is a material having thermal conduction properties suited for dissipating heat from the chip, and mechanical connection properties by bonding suited for securing the assembled elements in the package (that is to say the bonding of the chip 2 to the heat sink 7).

The integrated circuit 1 further comprises a heat sink 7 which is typically made of metal having a sufficiently large coefficient of thermal conduction, for example copper. The heat sink 7 comprises a mounting area 71 and a peripheral region 72. The mounting area 71 has an upper face 700 and a lower face 701. The lower face 701 of the mounting area 71 is fixed to the chip 2 via the thermal interface material layer 6.

The mounting area 71 of the heatsink 7 allows to evacuate the heat coming from the electronic chip 2 via the thermal interface material layer 6 towards the outside of the integrated circuit package 1.

The peripheral region 72 of the heatsink 7 is fixed to the support substrate 3 via a layer of an adhesive material 8, for example glue. The peripheral region 72 has a collar shape, and extends vertically from the mounting area 71 towards the support substrate 3, and can also extend obliquely as shown in FIG. 1.

Figure 2:
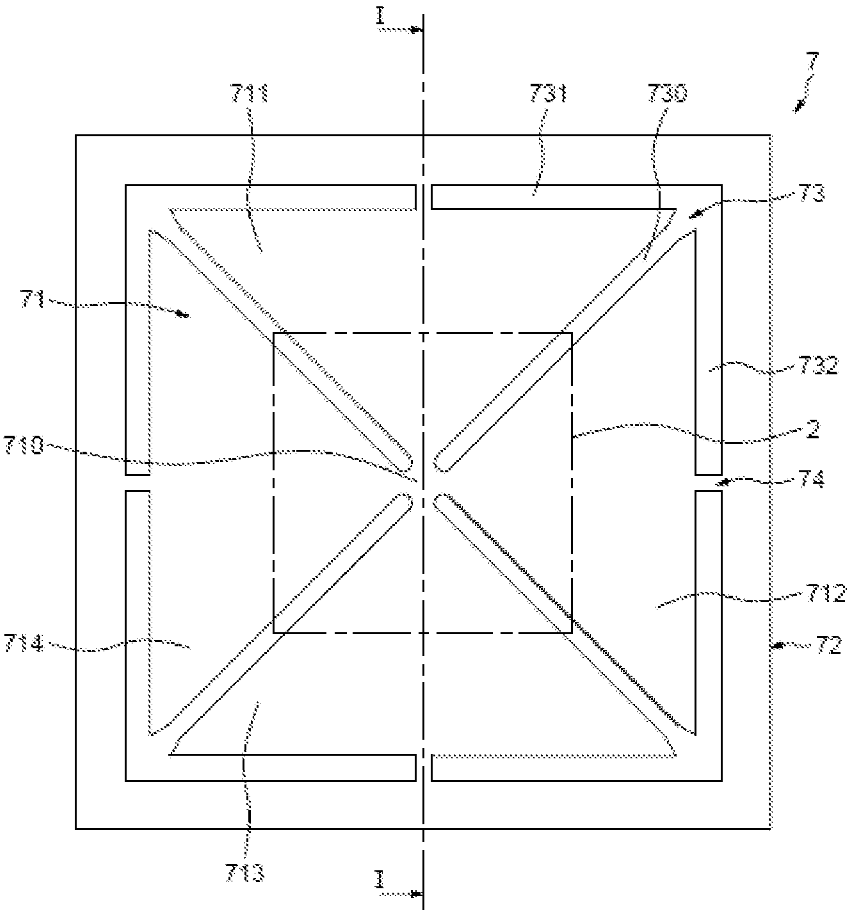
FIG. 2 schematically illustrates a top view of the heat sink of the integrated circuit shown in FIG. 1.

FIG. 2 schematically illustrates a top view of the heat sink of the integrated circuit 1 previously described in relation to FIG. 1.

The heat sink 7 comprises open notches 73 crossing the entire thickness of the heat sink 7. The open notches 73 extend into the mounting area 71 so as to form fins, for example four fins 711, 712, 713, 714 in the mounting area 71. The fins 711, 712, 713, 714 are separated from each other by the open notches 73 which delimit the outline of each of the fins.

The fins 711, 712, 713, 714 formed in the mounting area 71 of the heat sink 7 have the advantage of reducing the mechanical stresses, in particular at the corners of the electronic chip 2. More particularly, the expansion stresses are strongly reduced at the edge of the chip 2 which allows to avoid a detachment of the thermal interface material 6 and, at the same time, of the heat sink 7, in particular at the places where the risk of detachment is the highest.

Each fin is separated from the neighboring fins by the open notches 73 which prevent the stresses from being transmitted between the fins 711, 712, 713, 714. For example, the fin 711 can expand when the heatsink 7 is exposed to high temperatures, then to cooling at ambient temperature, in particular during annealing. Since the fins 711, 712, 713, 714 are separated from each other, the expansion of the fin 711 does not cause mechanical stress in other fins, in particular the closest fins 712 and 714.

Consequently, the heat sink 7 according to this aspect undergoes few mechanical stresses and the thermal interface material 6 according to this same aspect has a reduced risk of delamination, in particular at the corners of the chip 2 on which is fixed the mounting area 71.

For example, the open notches 73 include radial notches 730 and peripheral notches 731 and 732. The radial notches 730 extend between a central region 710 of the mounting area 71 and the peripheral region 72. The radial notches 730 allow to space the fins 711, 712, 713, 714 so as to limit the expansion stresses transmitted between them in the mounting area 71. The radial notches 730 can have a width comprised between 500 and 2000 μm.

The peripheral notches 731 and 732 extend in the circumference of the mounting area 71, between the mounting area 71 and the peripheral region 72 of the heat sink 7. The peripheral notches 731 and 732 allow to space each fin from the peripheral region 72 so as to limit the transmission of stresses between fins 711, 712, 713, 714 via the peripheral region 72. The peripheral notches 731 and 732 can have a width comprised between 500 and 2000 μm.

The fins 711, 712, 713, 714 are connected to each other by the central region 710 of the mounting area 71 and to the peripheral region 72 by connecting tabs 74. For example, each fin is connected locally to the peripheral region 72 by a connecting tab 74.

The fins 711, 712, 713, 714 are therefore supported on the one hand by the peripheral region 72 via the connecting tabs 74 and on the other hand against each other by the central region 710 of the mounting area 71.

The connecting tabs 74 and the central region 710 are configured to allow plastic deformation of the respective fins 711, 712, 713, 714 allowing to limit the transmission of mechanical stresses from one fin to another. In particular, the metal thickness of the heat sink may be reduced at the tabs 74 in this regard (the reduced thickness tabs 74 being shown in the sectional planes of FIGS. 1 and 4).

By way of example, the mechanical stresses were simulated by computer on the heat sink 7 as described in relation to FIG. 2, in particular on the mounting face 71 fixed on the chip 2, and compared with simulation results obtained for stresses undergone by a conventional heatsink having neither notches nor fins, and under the same conditions, that is to say with the same dimensions, the same materials and according to the same causes of mechanical stresses (annealing, variations in temperature). The mounting area 71 of the heat sink 7 has a maximum computer-simulated mechanical stress of 17.9 MPa (mega Pascal) and that of the conventional heat sink has a maximum computer-simulated mechanical stress of 23.2 MPa.

Figure 3:
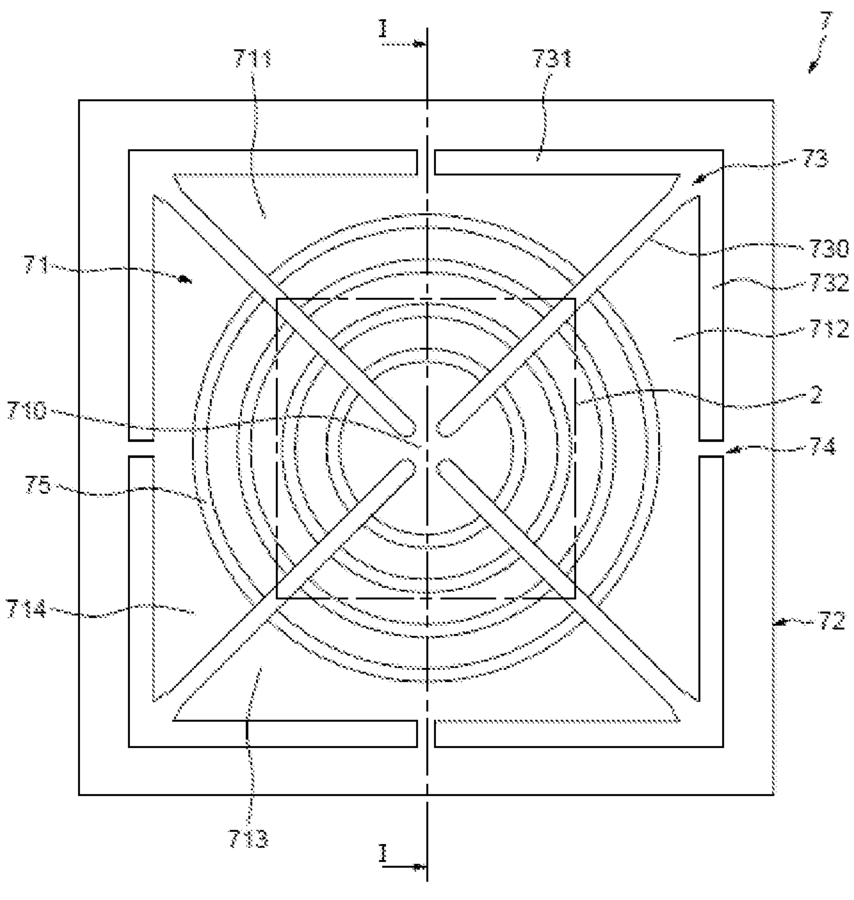
FIG. 3 schematically illustrates a bottom view of the heat sink of the package shown in FIGS. 1 and 2.

FIG. 3 schematically illustrates a bottom view of the heat sink of the package 1 previously described in relation to FIGS. 1 and 2.

The mounting area 71 comprises an at least partially ribbed surface 75. The at least partially ribbed surface 75 is in contact with the thermal interface material layer 6 covering the electronic chip 2.

Indeed, the surface of the lower face 701 of the mounting area 71 can provide grooves allowing to deform the thermal interface material layer 6. In particular, each groove has a depth into which the thermal interface material 6 can fill and allows to form a rough attachment surface. The at least partially ribbed surface 75 therefore allows to reduce the delamination between the mounting area 71 and the thermal interface material layer 6. In the same way, the thermal interface material 6 can also fill into the notches 730 and go up to mid-height of the notches 730. This improves the adhesion of the thermal interface material 6 to the heat sink 7.

Furthermore, the grooves of the at least partially ribbed surface 75 are advantageously arranged in concentric circles. The arrangement of the grooves in concentric circles makes it easier to attach the mounting area 71 to the electronic chip 2 and to limit the propagation of delamination over the entire surface of the mounting area 71 in the direction of the expansion stresses, that is to say from the central region 710 to the peripheral region 72 of the heatsink 7. The concentric circles can be spaced apart by a distance comprised between 1 and 3 mm.

Thus, the mechanical stresses are not only reduced on the mounting area 71 but furthermore the resistance to delamination of the assembly is greater.

Figure 4:
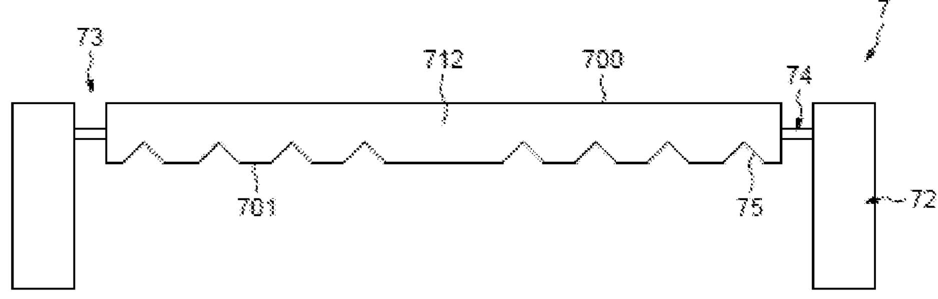
FIG. 4 schematically illustrates a sectional view of the heat sink shown in FIGS. 1, and 3.

FIG. 4 schematically illustrates a sectional view of the heat sink 7 previously described in relation to FIGS. 1, 2 and 3, along the axis I-I of FIGS. 2 and 3.

The depth of the grooves is comprised between 50 and 300 μm. The at least partially ribbed surface 75 of the mounting area 71 can, in particular, comprise microscopic or macroscopic grooves to limit the propagation of delamination in the mounting area 71. The macroscopic grooves can correspond to grooves having a depth greater than 500 μm and the microscopic grooves can correspond to grooves having a depth of less than 50 μm. The microscopic and macroscopic grooves increase the roughness of the at least partially ribbed surface 75 by their particular shape but also allow to lengthen the path travelled on the surface by the delaminations. Indeed, the delaminations are less able to pass through a groove than a flat surface of the mounting area 71 through which the propagation is direct. The macroscopic grooves can more effectively slow down the propagation of delaminations but can be more constraining to be formed than the microscopic grooves which can be more numerous on the same space of the mounting area 71.

The invention claimed is:

1. An integrated circuit device, comprising:
- an electronic integrated circuit chip having a first face and a second face;
- a thermal interface material layer covering the first face; and
- a heat sink comprising a mounting area fixed to the electronic integrated circuit chip via the thermal interface material layer;
- wherein the heat sink comprises open notches extending into the mounting area to form a plurality of fins separated from each other by the open notches;
- wherein the heat sink further comprises a peripheral region and wherein the open notches comprise radial notches extending between a central region of the mounting area and the peripheral region of the heat sink; and
- wherein the open notches further comprise peripheral notches extending from ends of the radial notches in a position between the mounting area and the peripheral region.

2. The integrated circuit device according to claim 1, wherein the mounting area of the heatsink comprises an at least partially ribbed surface including grooves that are in contact with the thermal interface material layer.

3. The integrated circuit device according to claim 2, wherein said grooves are arranged in concentric circles.

4. The integrated circuit device according to claim 2, wherein a depth of the grooves is comprised between 50 and 300 μm.

5. An integrated circuit device, comprising:
- an electronic integrated circuit chip having a first face and a second face;
- a thermal interface material layer covering the first face; and
- a heat sink comprising a mounting area fixed to the electronic integrated circuit chip via the thermal interface material layer;
- wherein the heat sink comprises open notches extending into the mounting area to form a plurality of fins separated from each other by the open notches;
- wherein the heat sink further comprises a peripheral region and wherein the open notches comprise radial notches extending between a central region of the mounting area and the peripheral region of the heat sink; and
- wherein the fins are connected to each other at the central region of the mounting area and are connected to the peripheral region by connecting tabs extending across a width of the peripheral notches.

6. The integrated circuit device according to claim 5, wherein the mounting area of the heatsink comprises an at least partially ribbed surface including grooves that are in contact with the thermal interface material layer.

7. The integrated circuit device according to claim 6, wherein said grooves are arranged in concentric circles.

8. The integrated circuit device according to claim 6, wherein a depth of the grooves is comprised between 50 and 300 μm.

9. A heat sink for mounting to an electronic integrated circuit chip, comprising:
- a mounting region having an upper face and a lower face; and
- a peripheral region surrounding the mounting region;
- a plurality of first open notches extending through the mounting region to define a plurality fins; and
- a plurality of second open notches extending between the mounting region and the peripheral region;
- wherein the fins are connected to the peripheral region by connecting tabs extending across a width of the second open notches.

10. The heat sink according to claim 9, wherein each first open notch comprises a radial notch extending between a center of the mounting region and the peripheral region.

11. The heat sink according to claim 9, wherein the lower face of the mounting region has an at least partially ribbed surface including grooves.

12. The heat sink according to claim 11, wherein said grooves are arranged in concentric circles.

13. The heat sink according to claim 12, wherein a depth of the grooves is comprised between 50 and 300 μm.

14. A heat sink for mounting to an electronic integrated circuit chip, comprising:
- a mounting region having an upper face and a lower face; and
- a peripheral region surrounding the mounting region;
- a plurality of first open notches extending through the mounting region to define a plurality fins; and
- a plurality of second open notches extending between the mounting region and the peripheral region;

wherein each first open notch comprises a radial notch extending between a center of the mounting region and the peripheral region; and wherein each second open notch extends from an end of the radial notch.

15. The heat sink according to claim 14, wherein the lower face of the mounting region has an at least partially ribbed surface including grooves.

16. The heat sink according to claim 15, wherein said grooves are arranged in concentric circles.

17. The heat sink according to claim 16, wherein a depth of the grooves is comprised between 50 and 300 μm.

18. A heat sink for mounting to an electronic integrated circuit chip, comprising:

a mounting region having an upper face and a lower face; and a peripheral region surrounding the mounting region;

a plurality of first open notches extending through the mounting region to define a plurality fins; and a plurality of second open notches extending between the mounting region and the peripheral region;

wherein each first open notch comprises a radial notch extending between a center of the mounting region and the peripheral region; and wherein the fins are connected to each other at the center of the mounting region.

19. The heat sink according to claim 18, wherein the lower face of the mounting region has an at least partially ribbed surface including grooves.

20. The heat sink according to claim 19, wherein said grooves are arranged in concentric circles.

21. The heat sink according to claim 20, wherein a depth of the grooves is comprised between 50 and 300 μm.

22. An integrated circuit device, comprising:

an electronic integrated circuit chip having a first face and a second face;

a thermal interface material layer covering the first face; and a heat sink comprising a plate having an upper surface and a lower surface, wherein the lower surface is fixed to the first face of the electronic integrated circuit chip via the thermal interface material layer;

wherein the plate of the heat sink comprises first notches extending in depth completely through a thickness of the plate from the upper surface to the lower surface and extending in length outwardly from a central region of the heat sink to a peripheral region of the heat sink;

wherein the first notches extend radially; and wherein the plate of the heat sink further comprises second notches extending in depth completely through the thickness of the plate from the upper surface to the lower surface and extending in length away from distal ends of the first notches.

23. The integrated circuit device according to claim 22, wherein the lower surface of the plate comprises a ribbed surface including grooves that extend in depth from the lower surface only partially through the thickness of the plate.

24. The integrated circuit device according to claim 23, wherein said grooves are arranged in concentric circles.

* * * * *